US010804910B2

(12) United States Patent
Sato

(10) Patent No.: US 10,804,910 B2
(45) Date of Patent: Oct. 13, 2020

(54) CIRCUIT DEVICE, OSCILLATOR, ELECTRONIC APPARATUS AND MOVING OBJECT

(71) Applicant: SEIKO EPSON CORPORATION, Tokyo (JP)

(72) Inventor: Hideki Sato, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/715,482

(22) Filed: Dec. 16, 2019

(65) Prior Publication Data

US 2020/0195260 A1    Jun. 18, 2020

(30) Foreign Application Priority Data

Dec. 18, 2018   (JP) ................................. 2018-235963

(51) Int. Cl.
*H03L 7/099*         (2006.01)
*H03L 1/02*          (2006.01)
(Continued)

(52) U.S. Cl.
CPC .............. *H03L 7/099* (2013.01); *H03L 1/028* (2013.01); *H03L 7/00* (2013.01); *H03L 7/0891* (2013.01); *H03L 7/0893* (2013.01); *H03L 7/189* (2013.01); *H03L 7/1976* (2013.01); *H03M 7/3026* (2013.01); *H04B 1/707* (2013.01); *H03B 5/32* (2013.01)

(58) Field of Classification Search
CPC ......... H03L 7/00; H03L 7/0893; H03L 7/099; H03L 7/0891; H03L 7/189; H03L 7/1976; H04B 1/707; H03M 7/3026; H03B 5/32

USPC ...... 331/158, 1 A, 16, 34, 78; 327/156, 159; 375/376, 132
See application file for complete search history.

(56) References Cited

U.S. PATENT DOCUMENTS 7,813,411 B1 * 10/2010 Li ........................ H03C 3/0933
                                                              375/130
2008/0266013 A1   10/2008 Kato
(Continued)

FOREIGN PATENT DOCUMENTS

| JP | 2016-040869 A | 3/2016 |
|---|---|---|
| JP | 2016-076918 A | 5/2016 |
| WO | WO-2005/078915 A1 | 8/2005 |

*Primary Examiner* — Arnold M Kinkead
(74) *Attorney, Agent, or Firm* — Rankin, Hill & Clark LLP

(57) ABSTRACT

A circuit device includes a phase comparison circuit that performs phase comparison between a reference clock signal and a feedback clock signal, a control voltage generation circuit that generates a control voltage, a voltage controlled oscillation circuit that generates a clock signal, a dividing circuit that divides the clock signal and outputs the feedback clock signal, a processing circuit that sets a division ratio of the dividing circuit, a first register in which slope information of a waveform signal for spreading the frequency of the clock signal is set, and a second register in which amplitude information of the waveform signal is set. The processing circuit generates a waveform signal value based on the slope information and the amplitude information set in the first and second registers, and outputs division ratio data based on the waveform signal value and the division ratio setting value to the dividing circuit.

10 Claims, 10 Drawing Sheets

(51) Int. Cl.
  *H03L 7/089* (2006.01)
  *H03L 7/00* (2006.01)
  *H03L 7/189* (2006.01)
  *H03L 7/197* (2006.01)
  *H04B 1/707* (2011.01)
  *H03M 7/36* (2006.01)
  *H03B 5/32* (2006.01)

(56) References Cited

U.S. PATENT DOCUMENTS

2010/0171535 A1* 7/2010 Shanan ................ H03L 7/0893
                                            327/157
2016/0049947 A1   2/2016 Adachi
2016/0079988 A1* 3/2016 Shiozaki ............... H03L 7/0802
                                            327/156
2016/0099719 A1   4/2016 Iwasaki

* cited by examiner

CIRCUIT DEVICE, OSCILLATOR, ELECTRONIC APPARATUS AND MOVING OBJECT

The present application is based on, and claims priority from JP Application Serial Number 2018-235963, filed Dec. 18, 2018, the disclosure of which is hereby incorporated by reference herein in its entirety.

BACKGROUND

1. Technical Field

The present disclosure relates to a circuit device, an oscillator, an electronic apparatus, and a moving object.

2. Related Art

In recent years, an electro magnetic interference (EMI) has been a problem as an effect of electromagnetic waves radiated from electronic apparatuses on other electronics. In particular, a clock signal used for transmission/reception of data between electronic apparatuses has a high frequency and becomes a source of noise of the EMI. Accordingly, various countermeasures have been taken to suppress the adverse effects of electromagnetic wave radiation caused by the clock signal, and one of such countermeasures is spread spectrum. As a related art of spread spectrum, for example, there is a technology disclosed in JP-A-2016-40869. JP-A-2016-40869 discloses a spread spectrum clock generation circuit including a triangular wave generator. Specifically, a configuration is disclosed in which +1 or −1 output from a selector is added and the output of the selector is switched when an added value reaches the maximum value of the amplitude of the triangular wave.

In the spread spectrum clock generation circuit of the related art, when a spread width corresponding to the amplitude of the triangular wave is changed, a spread rate is also changed in conjunction therewith. That is, there is a problem that the spread rate and the spread width cannot be freely set.

SUMMARY

An aspect of the present disclosure relates to a circuit device including: a phase comparison circuit performing a phase comparison between a reference clock signal and a feedback clock signal; a control voltage generation circuit generating a control voltage based on a result of the phase comparison; a voltage controlled oscillation circuit generating a clock signal having a frequency corresponding to the control voltage; a dividing circuit that divides the clock signal and outputs the feedback clock signal; a processing circuit setting a division ratio of the dividing circuit; a first register in which slope information of a waveform signal for spreading the frequency of the clock signal is set; and a second register in which amplitude information of the waveform signal is set, in which the processing circuit generates a waveform signal value of the waveform signal based on the slope information set in the first register and the amplitude information set in the second register, and outputs division ratio data based on the waveform signal value and the division ratio setting value to the dividing circuit.

DESCRIPTION OF EXEMPLARY EMBODIMENTS

Hereinafter, the present embodiment will be described. Note that the present embodiment to be described below does not unduly limit the contents of the present disclosure described in the appended claims. In addition, all configurations to be described in the present embodiment are not limited to being essential constituent conditions.

1. Circuit Device

Figure 1:
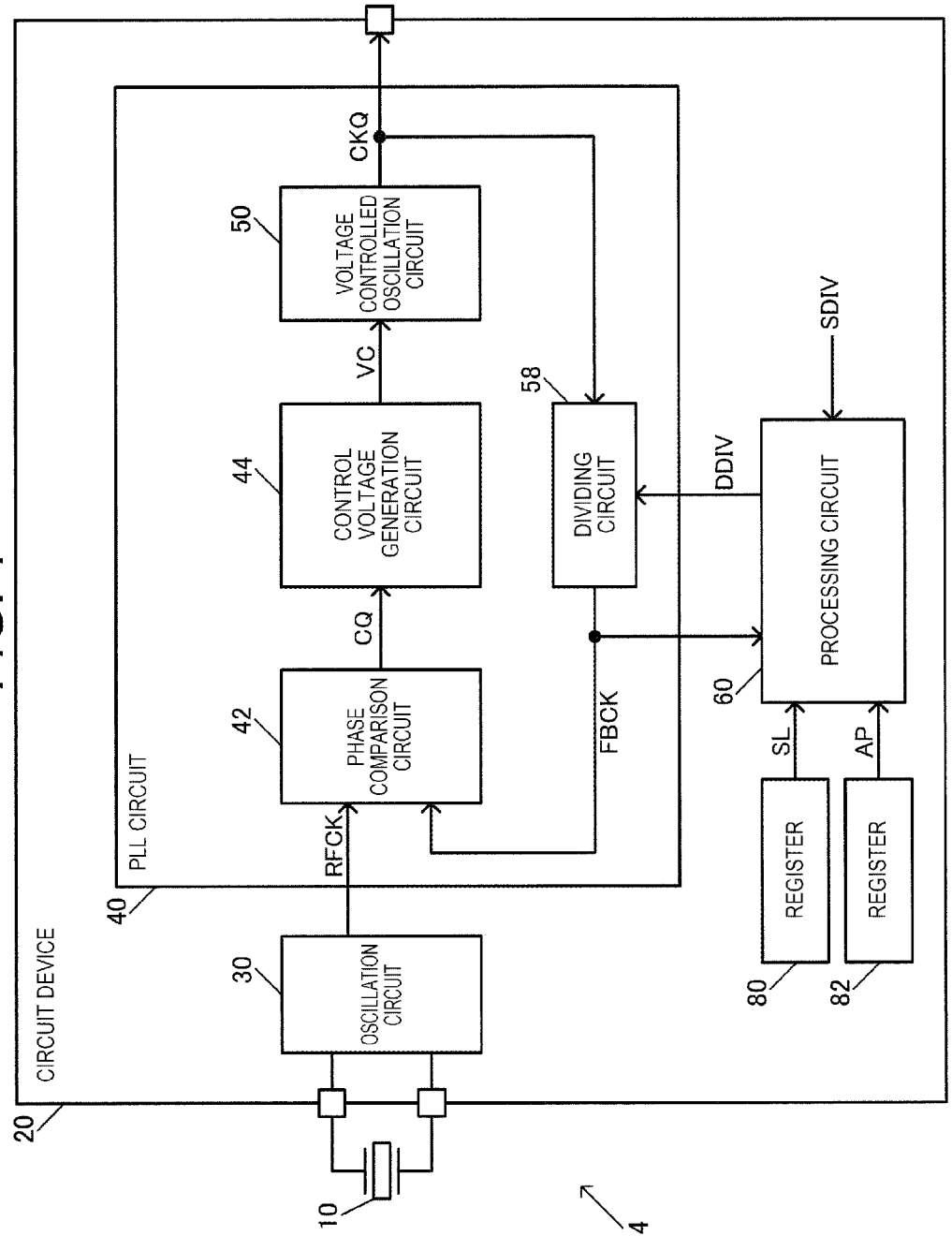
FIG. 1 shows a configuration example of a circuit device according to a present embodiment.

FIG. 1 shows a configuration example of a circuit device 20 according to a present embodiment. In the present embodiment, the circuit device 20 used in an oscillator 4 in which a vibrator 10 vibrates to generate a clock signal will be mainly described as an example. The present embodiment can also be applied to the circuit device 20 of a PLL circuit 40 that does not use an oscillation circuit 30 of the vibrator 10.

The oscillator 4 includes the circuit device 20 and the vibrator 10. The vibrator 10 is electrically coupled to the circuit device 20. For example, the vibrator 10 and the circuit device 20 are electrically coupled using an internal wiring, a bonding wire, a metal bump, or the like of a package that accommodates the vibrator 10 and the circuit device 20.

The vibrator 10 is an element that generates mechanical vibration by an electric signal. The vibrator 10 can be realized by a vibrator element such as a quartz crystal vibrator element, for example. For example, the vibrator 10 can be realized by a quartz crystal vibrator element in which a cut angle vibrates in a thickness-slide manner such as an AT cut or a SC cut. For example, the vibrator 10 may be a vibrator of a simple packaged crystal oscillator (SPXO). Alternatively, the vibrator 10 may be a vibrator built in a constant temperature oven controlled crystal oscillator (OCXO) having a constant temperature oven, or a vibrator built in a temperature compensated crystal oscillator (TCXO) having no constant temperature oven. Note that the vibrator 10 according to the present embodiment can be realized by various vibrator elements such as vibrator elements other than a thickness-slide vibration type or piezoelectric vibrator elements formed of materials other than quartz crystal. For example, as the vibrator 10, a surface acoustic wave (SAW) resonator, a micro electro mechanical systems (MEMS) vibrator as a silicon vibrator formed using a silicon substrate, or the like may be adopted.

The circuit device 20 is an integrated circuit device called an integrated circuit (IC). For example, the circuit device 20 is an IC manufactured by a semiconductor process, and is a semiconductor chip in which circuit elements are formed on a semiconductor substrate. The circuit device 20 includes the oscillation circuit 30, the PLL circuit 40, the processing circuit 60, and registers 80 and 82.

The oscillation circuit 30 generates a reference clock signal RFCK by causing the vibrator 10 to oscillate. That is, the oscillation circuit 30 causes the vibrator 10 to vibrate and generates the reference clock signal RFCK that is an oscillation signal. For example, the circuit device 20 includes first and second vibrator couple terminals. A first terminal electrode that is one end of the vibrator 10, which is an external component of the circuit device 20, is coupled to the first vibrator couple terminal, and a second terminal electrode that is the other end of the vibrator 10 is coupled to the second vibrator couple terminal. The first and second vibrator couple terminals are, for example, pads of the circuit device 20. The oscillation circuit 30 includes an oscillation drive circuit provided between the first vibrator couple terminal and the second vibrator couple terminal.

The reference clock signal RFCK is input to the PLL circuit 40. Then, a phase locked loop (PLL) operation is performed. For example, the PLL circuit 40 generates a clock signal CKQ having a frequency obtained by multiplying the frequency of the reference clock signal RFCK. That is, a highly accurate clock signal CKQ that is phase synchronized with the reference clock signal RFCK is generated. The PLL circuit 40 includes a phase comparison circuit 42, a control voltage generation circuit 44, a voltage controlled oscillation circuit 50, and a dividing circuit 58.

The phase comparison circuit 42 performs a phase comparison between the reference clock signal RFCK and a feedback clock signal FBCK. For example, the phase comparison circuit 42 compares the phases of the reference clock signal RFCK and the feedback clock signal FBCK, and outputs a signal CQ corresponding to a phase difference between the reference clock signal RFCK and the feedback clock signal FBCK as a signal of a phase comparison result. The signal CQ corresponding to the phase difference is, for example, a pulse signal of a pulse width proportional to the phase difference.

The control voltage generation circuit 44 generates a control voltage VC based on the result of the phase comparison obtained from the phase comparison circuit 42. For example, the control voltage generation circuit 44 generates the control voltage VC for controlling the oscillation of the voltage controlled oscillation circuit 50 by performing a charge pump operation or filter processing based on the signal CQ of the phase comparison result from the phase comparison circuit 42.

A voltage controlled oscillation circuit 50 which is a voltage controlled oscillator (VCO) generates a clock signal CKQ having a frequency corresponding to the control voltage VC. For example, an oscillation operation is performed based on the control voltage VC from the control voltage generation circuit 44 to generate the clock signal CKQ. For example, the voltage controlled oscillation circuit 50 generates a clock signal CKQ having a frequency that changes according to the control voltage VC by the oscillation operation. As an example, the voltage controlled oscillation circuit 50 has a variable capacity element such as a varactor. By changing the capacity of the variable capacity element based on the control voltage VC, the frequency of the clock signal CKQ that is an oscillation signal generated by the oscillation operation of the voltage controlled oscillation circuit 50 is changed.

The dividing circuit 58 divides the clock signal CKQ and outputs a feedback clock signal FBCK. For example, the dividing circuit 58 outputs a signal having a frequency obtained by dividing the frequency of the clock signal CKQ by the division ratio set by division ratio data DDIV as a feedback clock signal FBCK. For example, when the frequency of the clock signal CKQ is f and the division ratio of the dividing operation of the dividing circuit 58 is DIV, the frequency of the feedback clock signal FBCK becomes f/DIV. Then, as described above, the phase comparison circuit 42 performs a phase comparison between the reference clock signal RFCK from the oscillation circuit 30 and the feedback clock signal FBCK from the dividing circuit 58.

The processing circuit 60 sets the division ratio of the dividing circuit 58. For example, the processing circuit 60 sets the division ratio of the dividing circuit 58 by outputting the division ratio data DDIV to the dividing circuit 58. The division ratio data DDIV is data for setting the division ratio of the PLL circuit 40, and is data for determining the frequency of the clock signal CKQ. The processing circuit 60 sets the division ratio of the dividing circuit 58 based on the division ratio setting value SDIV, for example. The division ratio setting value SDIV is a setting value for setting the division ratio of the dividing circuit 58, and may be a value set in a register or the like, or input from the outside via a terminal or the like. The processing circuit 60 performs various control processing, setting processing, or calculation processing of the circuit device 20. For example, the processing circuit 60 performs control processing for each circuit block of the circuit device 20. The processing circuit 60 performs calculation processing such as delta sigma modulation processing, temperature compensation processing, aging correction processing, or digital filter processing, for example. The processing circuit 60 can be realized by an application specific integrated circuit (ASIC) using automatic placement and wiring such as a gate array. Alternatively, the processing circuit 60 may be realized by a processor such as a digital signal processor (DSP) or a central processing unit (CPU).

The register 80 is a register in which slope information SL of a waveform signal for spreading the frequency of the clock signal CKQ is set. The spread of the frequency of the clock signal CKQ is called, for example, spread spectrum. Hereinafter, the spread of the frequency of the clock signal CKQ is appropriately referred to as spectrum spread. The waveform signal is a waveform signal for the spread spectrum. The register 80 is a first register, and the register 82 is a second register. The waveform signal is a signal in which, for example, a first period where a waveform signal value monotonously increases and a second period where a waveform signal value monotonously decreases are alternately repeated. In addition, the waveform signal is realized by, for example, a triangular wave signal. The slope information SL is information for setting a slope value of the waveform signal, and is information for setting a rate of change corresponding to a gain of the waveform signal value. For example, the slope information is information for setting a first slope value of the waveform signal in the first period where the waveform signal value monotonously increases and a second slope value of the waveform signal in the second period where the waveform signal value monotonously decreases. The first and second slope values correspond to the rate of change of the waveform signal value. Amplitude information AP is information for setting an amplitude of the waveform signal, and is information corresponding to the spread width of the spread of the frequency of the clock signal CKQ. The registers 80 and 82 can be realized by a flip-flop circuit, for example. Alternatively, the registers 80 and 82 may be realized by a memory such as a random access memory (RAM).

As described above, the circuit device 20 according to the present embodiment includes the phase comparison circuit 42, the control voltage generation circuit 44, the voltage controlled oscillation circuit 50, the dividing circuit 58, the processing circuit 60, and the registers 80 and 82. For example, the PLL circuit 40 is configured with the phase comparison circuit 42, the control voltage generation circuit 44, the voltage controlled oscillation circuit 50, and the dividing circuit 58. The phase comparison circuit 42 performs a phase comparison between the reference clock signal RFCK and a feedback clock signal FBCK. The control voltage generation circuit 44 generates the control voltage VC based on the result of the phase comparison. The voltage controlled oscillation circuit 50 generates a clock signal CKQ having a frequency corresponding to the control voltage VC. The dividing circuit 58 divides the clock signal CKQ and outputs a feedback clock signal FBCK. The processing circuit 60 sets the division ratio of the dividing circuit 58. The slope information SL of the waveform signal for spreading the frequency of the clock signal CKQ is set in the register 80 and the amplitude information AP of the waveform signal is set in the register 82.

In the present embodiment, the processing circuit 60 generates a waveform signal value of the waveform signal based on the slope information SL set in the register 80 and the amplitude information AP set in the register 82. Specifically, the processing circuit 60 generates a waveform signal value VW of a waveform signal such as a triangular wave, as will be described later with reference to FIG. 3. Then, the processing circuit 60 outputs the division ratio data DDIV based on the waveform signal value VW and the division ratio setting value SDIV to the dividing circuit 58. For example, the processing circuit 60 performs spread spectrum using the waveform signal value VW to periodically change the frequency of the clock signal CKQ in a predetermined frequency bandwidth centered on a reference frequency that is a nominal frequency of the clock signal CKQ. Specifically, the processing circuit 60 performs control to change the division ratio of the dividing circuit 58 with time so that the frequency of the clock signal CKQ periodically changes in a predetermined frequency bandwidth centered on a reference frequency that is a nominal frequency. That is, the processing circuit 60 executes spread spectrum processing by performing control to change the division ratio set based on the division ratio setting value SDIV with time using the waveform signal value VW.

As described above, according to the circuit device 20 of the present embodiment, the spread spectrum processing is realized by outputting the division ratio data DDIV based on the waveform signal value VW and the division ratio setting value SDIV to the dividing circuit 58. As a result, an EMI noise can be reduced, and adverse effects of electromagnetic wave radiation caused by the clock signal CKQ can be suppressed. In the present embodiment, a waveform signal value of a waveform signal is generated based on not only the amplitude information of the waveform signal that realizes the spread spectrum but also the slope information of the waveform signal. As a result, for example, it becomes possible to prevent a situation in which the spread rate is changed in conjunction with the change of the spread width, and it is possible to realize the circuit device 20 that can freely set the spread rate and spread width of the spread spectrum with a simple configuration.

Figure 2:
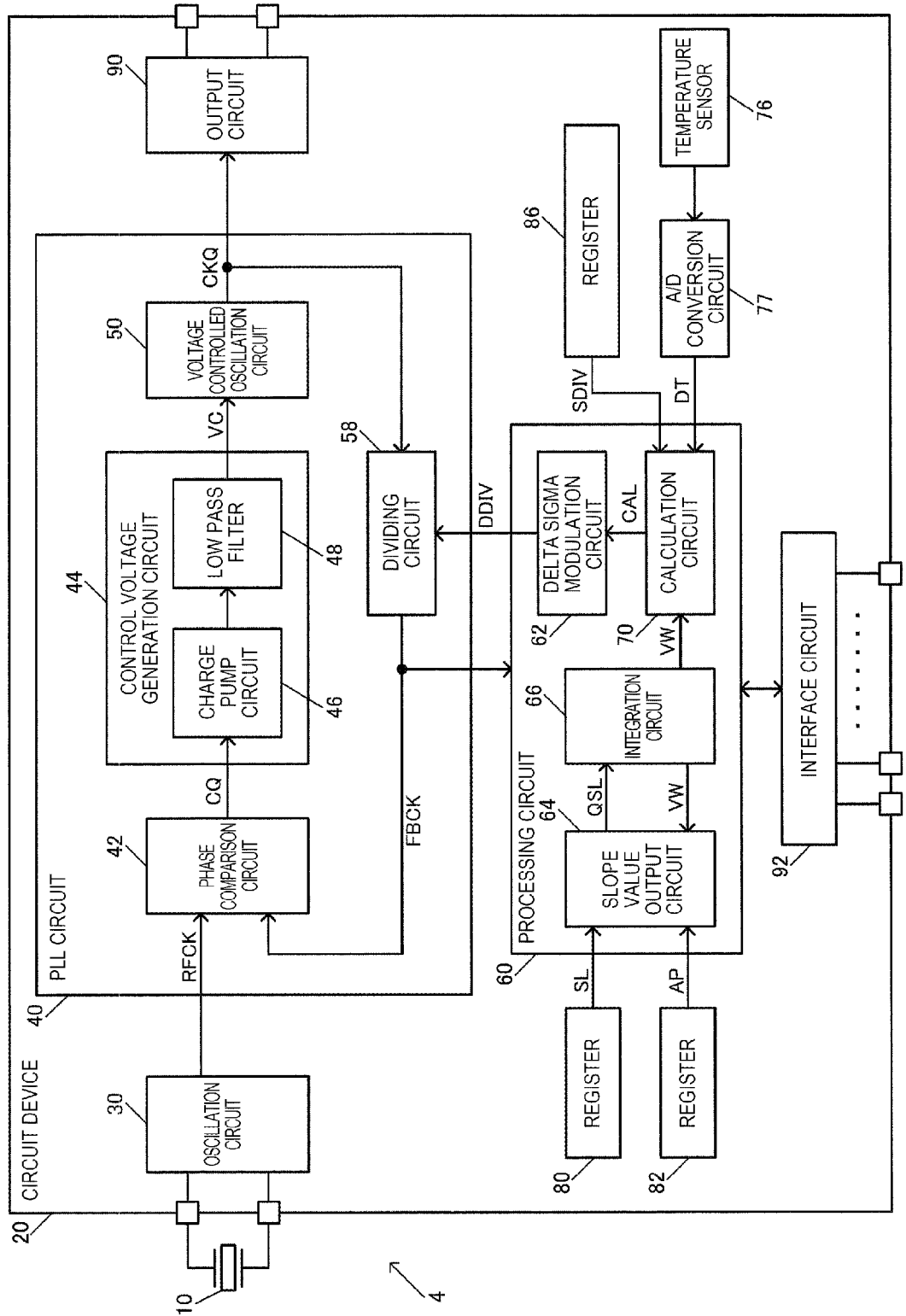
FIG. 2 shows a detailed configuration example of the circuit device according to the present embodiment.

FIG. 2 shows a configuration example of the circuit device 20 according to the present embodiment. In FIG. 2, the circuit device 20 includes a temperature sensor 76, an A/D conversion circuit 77, a register 86, an output circuit 90, and an interface circuit 92 in addition to the oscillation circuit 30, the PLL circuit 40, the processing circuit 60, and the registers 80 and 82. The processing circuit 60 performs a delta sigma modulation by a delta sigma modulation circuit 62, so that the PLL circuit 40 operates as a fractional N type PLL circuit. The circuit device 20 according to the present embodiment is not limited to the configuration shown in FIG. 2, and various modifications such as omitting some of these components or adding other components are possible.

The register 86 is a register in which the division ratio setting value SDIV is set. The register 86 can be realized by a flip-flop circuit, for example. Alternatively, the register 86 may be realized by a memory such as a RAM.

The temperature sensor 76 outputs a temperature dependent voltage that changes according to the temperature of the environment as a temperature detection voltage. The temperature of the environment is, for example, the temperature of the environment around the circuit device 20 and the vibrator 10. For example, the temperature sensor 76 generates a temperature dependent voltage using a circuit element having temperature dependency, and outputs the temperature dependent voltage with reference to a temperature independent voltage. For example, the temperature sensor 76 outputs a forward voltage of a PN bond as a temperature dependent voltage. The temperature independent voltage is, for example, a band gap reference voltage. The temperature sensor 76 may be provided outside the circuit device 20, and a temperature detection voltage from the temperature sensor 76 may be input to the circuit device 20 via an external coupling terminal of the circuit device 20.

The A/D conversion circuit 77 performs A/D conversion of the temperature detection voltage from the temperature sensor 76 and outputs digital temperature detection data DT. As an A/D conversion method of the A/D conversion circuit 77, for example, a successive comparison method or a method similar to the successive comparison method can be adopted. As the A/D conversion method, a delta sigma type, a flash type, a pipeline type, a double integration type, or the like may be adopted. Further, the A/D conversion circuit 77 may be provided outside the circuit device 20 similarly to the temperature sensor 76, and the temperature detection data DT may be input to the circuit device 20 via an external coupling terminal or the like of the circuit device 20.

The output circuit 90 receives the clock signal CKQ from the PLL circuit 40. The clock signal CKQ is output to the outside of the circuit device 20 in a signal format such as a low voltage differential signaling (LVDS), a positive emitter coupled logic (PECL), an high speed current steering logic (HCSL), or a differential complementary MOS (CMOS). For example, the output circuit 90 may be a circuit that can output the clock signal CKQ in all signal formats of LVDS, PECL, HCSL, and CMOS. In this case, the output circuit 90 outputs the clock signal CKQ in the signal format set by the processing circuit 60.

The output circuit 90 may be provided with a dividing circuit for the clock signal CKQ, for example. Then, the frequency of the clock signal CKQ may be set to a frequency desired by a user by dividing the clock signal CKQ by the dividing circuit.

The interface circuit 92 is a circuit that realizes an interface such as an inter integrated circuit (I2C) and a serial peripheral interface (SPI). That is, the interface circuit 92 performs interface processing with an external device.

Note that an external device such as a host may set the register values of the registers 80, 82, 86 and the register 84 shown in FIG. 11 described later via the interface circuit 92. That is, the external device may write the slope information SL, amplitude information AP, division ratio information of the feedback clock signal FBCK, and division ratio setting value SDIV of PLL circuit 40 to the registers 80, 82, 84, and 86, respectively, via the interface circuit 92. Alternatively, the circuit device 20 may be provided with a non-volatile memory, and the slope information SL, amplitude information AP, division ratio information, and division ratio setting value SDIV may be written into the non-volatile memory when the circuit device 20 is manufactured. After that, when the circuit device 20 is in operation, the slope information SL, amplitude information AP, division ratio information, and division ratio setting value SDIV may be loaded from the non-volatile memory to the registers 80, 82, 84, and 86.

In the present embodiment, the processing circuit performs a delta sigma modulation with respect to a calculated value CAL based on the waveform signal value VW and the division ratio setting value SDIV, and outputs the division ratio data DDIV to the dividing circuit 58. That is, the division ratio data DDIV based on the result of the delta sigma modulation is output to the dividing circuit 58. The delta sigma modulation is performed by a delta sigma modulation circuit 62 of the processing circuit 60.

Specifically, the phase comparison circuit 42 of the PLL circuit 40 compares the phases of the reference clock signal RFCK and the feedback clock signal FBCK, and outputs a signal CQ corresponding to the phase difference. The control voltage generation circuit 44 generates a control voltage VC based on the signal CQ corresponding to the phase difference. The control voltage generation circuit 44 includes a charge pump circuit 46 and a low pass filter 48. For example, the phase comparison circuit 42 outputs an up signal or a down signal, which is a phase comparison result, as the signal CQ. The charge pump circuit 46 converts the signal CQ that is an up signal or a down signal from the phase comparison circuit 42 into an output current. That is, the up signal and the down signal that are rectangular voltage pulses are converted into an output current that is a rectangular current pulse. For example, the charge pump circuit 46 outputs a positive current pulse when an up signal is input, and outputs a negative current pulse when a down signal is input. The low pass filter 48 smoothens the output signal of the charge pump circuit 46, generates a control voltage VC for controlling the oscillation frequency of the voltage controlled oscillation circuit 50, and outputs the generated control voltage to the voltage controlled oscillation circuit 50. Specifically, the low pass filter 48 converts the output current of the charge pump circuit 46 into current and voltage and performs filter processing. The control voltage VC, which is an output voltage of the low pass filter 48, increases when an up signal is output, and decreases when a down signal is output. The low pass filter 48 can be realized by a third-order or fourth-order RC filter, for example. That is, the low pass filter 48 can be realized by a passive RC filter using a resistor and a capacitor. The low pass filter 48 may be a passive filter using an inductor as a passive element.

When the control voltage VC from the low pass filter 48 is input to the voltage controlled oscillation circuit 50, the capacity of the variable capacity element realized by a varactor or the like changes, and the oscillation frequency of the voltage controlled oscillation circuit 50 is controlled. Then, a clock signal CKQ having a frequency set by the control voltage VC is output to the dividing circuit 58 or the output circuit 90. The voltage controlled oscillation circuit 50 can be realized by an LC oscillation circuit that performs an oscillation operation by a resonance circuit consisting of an inductor and a capacitor, for example.

In the present embodiment, the dividing circuit 58 and the delta sigma modulation circuit 62 constitute a fractional divider. The fractional divider divides the clock signal CKQ using the reciprocal of the multiplication ratio of the PLL circuit 40 as a division ratio, and outputs the divided clock signal to the phase comparison circuit 42 as a feedback clock signal FBCK. The delta sigma modulation circuit 62 performs delta sigma modulation on the value of the fraction part of the division ratio to generate a modulation value that is an integer. For example, the delta sigma modulation circuit 62 performs third-order or fourth-order delta sigma modulation processing. The value of the integer part of the division ratio and the added value of the modulation value are set in the dividing circuit 58 as setting values of the division ratio. As a result, a fractional N type PLL circuit 40 is realized.

Specifically, the delta sigma modulation circuit 62 operates based on, for example, the feedback clock signal FBCK, performs a delta sigma modulation that integrates and quantizes the fractional division ratio L/M, and generates a delta sigma modulation signal. The delta sigma modulation circuit 62 performs a process of adding/subtracting the delta sigma modulation signal and an integer division ratio N, and an output signal after the addition/subtraction is input to the dividing circuit 58 as division ratio data DDIV. In the output signal after the addition/subtraction, a plurality of integer division ratios in the range near the integer division ratio N change in time series, and the average value of time thereof matches N+L/M. This N+L/M is set by the division ratio setting value SDIV. For example, define that the frequency of the clock signal CKQ is f and the frequency of the reference clock signal RFCK is fref. In this case, in a normal state in which the phase of the reference clock signal RFCK and the phase of the feedback clock signal FBCK are synchronized, the relational expression of "f=(N+L/M)× fref" is established. By using the fractional N type PLL circuit 40 having such a configuration, a clock signal CKQ having a frequency obtained by multiplying the frequency of the reference clock signal RFCK by a division ratio represented by N+L/M can be generated.

In the present embodiment, the delta sigma modulation is performed with respect to the calculated value CAL based on the waveform signal value VW and the division ratio setting value SDIV, and the division ratio data DDIV based on the result of the delta sigma modulation is output to the dividing circuit 58. In this way, the fractional N type PLL circuit 40 can be realized by delta sigma modulation, and the division ratio of the dividing circuit 58 changes with time so that the frequency f of the clock signal CKQ periodically changes in a predetermined frequency bandwidth centered on the reference frequency, thereby, the spread spectrum can be realized. That is, it is possible to realize the spread spectrum in which the frequency f of the clock signal CKQ periodically changes between a frequency fh corresponding to VT that is an upper limit value of the waveform signal value VW in FIG. 3 to be described later and a frequency f1 corresponding to −VT that is a lower limit value of the waveform signal value VW.

By doing so, it is possible to realize a fractional divider in the fractional N type PLL circuit 40 by delta sigma modulation, reduce EMI noise, and suppress adverse effects of electromagnetic wave radiation caused by the clock signal CKQ.

In the present embodiment, the processing circuit generates a temperature compensation value of the temperature characteristic of the reference clock signal RFCK based on the temperature detection data DT based on the detection voltage of the temperature sensor 76. For example, a temperature compensation value TCP shown in FIG. 11 is generated. This temperature compensation value TCP is a compensation value for suppressing or canceling fluctuations in the oscillation frequency of the vibrator 10 due to temperature changes. The processing circuit 60 performs calculation processing of the temperature compensation based on the temperature detection data DT that changes according to the temperature and the data of the temperature compensated coefficient that is the coefficient of the approximate function, and generates the temperature compensation value TCP. The processing circuit 60 performs adding processing of the waveform signal value VW, the division ratio setting value SDIV, and the temperature compensation value TCP to obtain a calculated value CAL. For example, a calculation circuit 70 of the processing circuit 60 performs processing of obtaining the calculated value CAL by performing generation processing of the temperature compensation value TCP and adding processing of the waveform signal value VW, the division ratio setting value SDIV, and the temperature compensation value TCP. Thereafter, the delta sigma modulation circuit 62 of the processing circuit 60 performs delta sigma modulation processing with respect to the obtained calculated value CAL, and outputs the division ratio data DDIV to the dividing circuit 58.

In this way, it is possible to realize a fractional divider and suppression of the adverse effects of EMI, and it is possible to realize temperature compensated processing in which fluctuations in the frequency of the clock signal CKQ due to temperature changes can be suppressed. In addition, according to the present embodiment, the fractional division processing for realizing the fractional divider, the spread spectrum processing for suppressing the adverse effects of EMI, and the temperature compensated processing are collectively executed by the digital calculation processing in the processing circuit 60. Therefore, the fractional division processing, the spread spectrum processing, and the temperature compensated processing can be realized while suppressing an increase in the circuit scale of the circuit device 20.

In particular, in the present embodiment, the fractional division processing and the temperature compensated processing are collectively executed by the processing circuit 60 by utilizing the fact that the fractional divider can set the division ratio by fraction. That is, in FIG. 2, since the calculation circuit 70 performs the temperature compensated processing based on the temperature detection data, the calculated value CAL after the temperature compensated processing becomes a value including fraction. Even when the calculated value CAL is a value including fraction, the fractional divider configured with the dividing circuit 58 and the delta sigma modulation circuit 62 can set a division ratio based on the calculated value CAL including fraction. Therefore, the processing circuit 60 can execute the batch processing of the fractional division processing and the temperature compensated processing.

As shown in FIG. 2, the processing circuit 60 includes a slope value output circuit 64 and an integration circuit 66. The slope value output circuit 64 outputs either a positive slope value or a negative slope value as an output slope value QSL based on the slope information SL. For example, the slope value output circuit 64 outputs, to the integration circuit 66, either a positive slope value VSL or a negative slope value −VSL shown in FIG. 3 described later as an output slope value QSL based on the slope information SL set in the register 80. The integration circuit 66 integrates the output slope value QSL and outputs the integrated value obtained by the integration as a waveform signal value VW. For example, when the slope value output circuit 64 outputs a positive slope value VSL as an output slope value QSL, the integration circuit 66 integrates the positive slope value VSL and outputs the integrated value obtained by the integration as a waveform signal value VW. Further, when the slope value output circuit 64 outputs a negative slope value −VSL as an output slope value QSL, the integration circuit 66 integrates the negative slope value −VSL, and outputs the integrated value obtained by the integration as a waveform signal value VW.

When outputting the positive slope value VSL as an output slope value QSL, the slope value output circuit 64 outputs the negative slope value −VSL as an output slope value QSL when the waveform signal value VW reaches a first threshold value set by the amplitude information AP. For example, in FIG. 3, when the slope value output circuit 64 outputs a positive slope value VSL and the waveform signal value VW reaches VT, which is the first threshold value, the slope value output circuit 64 switches the output from the output of the positive slope value VSL to the output of the negative slope value −VSL. For example, the slope value output circuit 64 monitors the waveform signal value VW output from the integration circuit 66, and when the waveform signal value VW reaches the first threshold value VT, the output is switched from the output of the positive slope value VSL to the output of the negative slope value −VSL.

When outputting the negative slope value −VSL as an output slope value QSL, the slope value output circuit 64 outputs the positive slope value VSL as an output slope value QSL when the waveform signal value VW reaches a second threshold value set by the amplitude information AP. For example, in FIG. 3, when the slope value output circuit 64 outputs a negative slope value −VSL and the waveform signal value VW reaches −VT, which is the second threshold value, the slope value output circuit 64 switches the output from the output of the negative slope value −VSL to the output of the positive slope value VSL. For example, the slope value output circuit 64 monitors the waveform signal value VW output from the integration circuit 66, and when the waveform signal value VW reaches the second threshold value −VT, the output is switched from the output of the negative slope value −VSL to the output of the positive slope value VSL.

In this way, the spread spectrum processing in which the spread rate and the spread width can be set variably can be realized with a simple circuit configuration using the slope value output circuit 64 and the integration circuit 66. For example, the slope value output circuit 64 outputs a positive slope value VSL based on the slope information SL, whereby a positive slope waveform signal value VW in which the slope is variably set by the slope information SL can be output. The slope value output circuit 64 outputs a negative slope value −VSL based on the slope information SL, whereby a negative slope waveform signal value VW in which the slope is variably set by the slope information SL can be output. As a result, the spread rate of the spread spectrum can be adjusted. The slope value output circuit 64 switches the output to a negative slope value −VSL when the waveform signal value VW reaches the first threshold value VT set based on the amplitude information AP, and switches the output to a positive slope value VSL when the waveform signal value VW reaches the second threshold value −VT, whereby the spread width of the spread spectrum can also be set variably.

2. Operation

Figure 3:
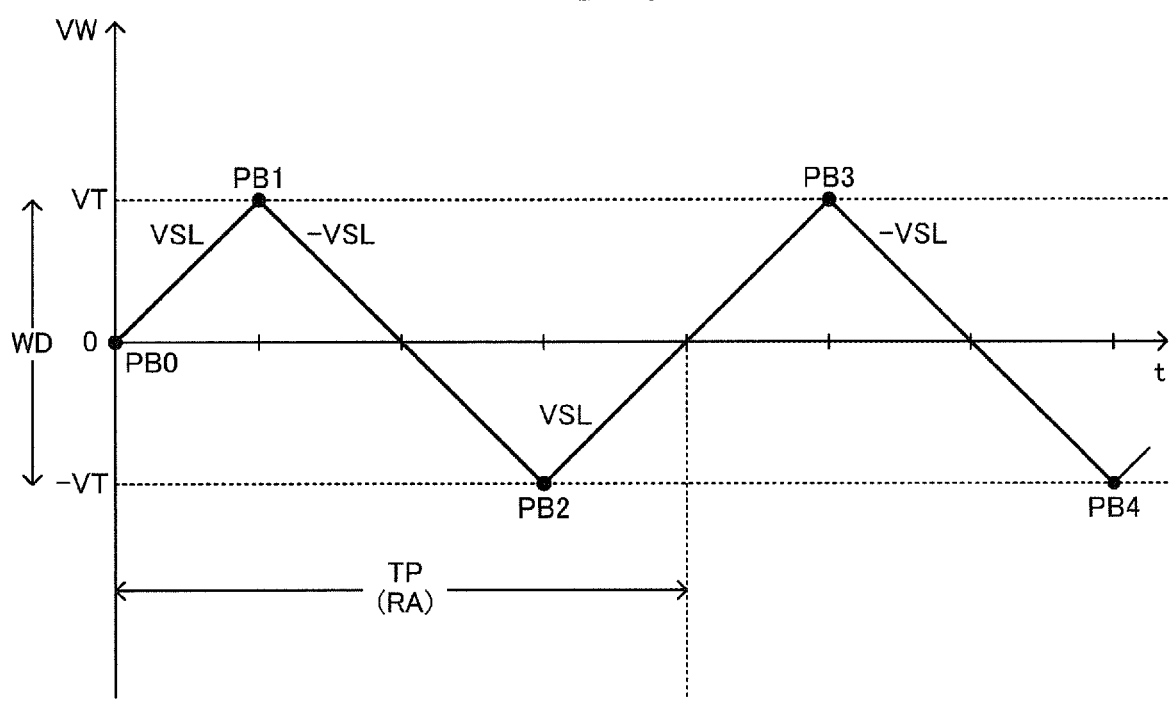
FIG. 3 is an operation explanatory diagram of the circuit device according to the present embodiment.

Next, the operation of the circuit device 20 of the present embodiment will be described in detail. FIG. 3 is an operation explanatory diagram of the circuit device 20 according to the present embodiment. The horizontal axis in FIG. 3 is time, and the vertical axis is the waveform signal value VW. In FIG. 3, the waveform signal is a triangular wave signal, and the waveform signal value VW increases at the rate of change of the positive slope value VSL from a point PB0 where the waveform signal value VW becomes zero. That is, the waveform signal value VW increases by performing integration processing in which the positive slope value VSL corresponding to the change value of the waveform signal value VW is integrated by the integration circuit 66. When the waveform signal value VW reaches the first threshold value VT at a point PB1, the slope value output circuit 64 switches the output slope value QSL from the positive slope value VSL to the negative slope value −VSL. As a result, the waveform signal value VW decreases from the point PB1 at which the waveform signal value VW becomes the first threshold value VT at the rate of change of the negative slope value −VSL. That is, the waveform signal value VW decreases by performing integration processing in which the negative slope value −VSL corresponding to the change value of the waveform signal value VW is integrated by the integration circuit 66. When the waveform signal value VW reaches the second threshold value −VT at a point PB2, the slope value output circuit 64 switches the output slope value QSL from the negative slope value −VSL to the positive slope value VSL. As a result, the waveform signal value VW increases from the point PB2 at which the waveform signal value VW becomes the second threshold value −VT at the rate of change of the positive slope value VSL. When the waveform signal value VW reaches the first threshold value VT at a point PB3, the slope value output circuit 64 switches the output slope value QSL from the positive slope value VSL to the negative slope value −VSL. As a result, the spread rate RA and spread width WD of the spread spectrum can be set variably. In FIG. 3, TP is a period of a triangular waveform signal, and the spread rate can be expressed as RA=1/TP.

Figure 4:
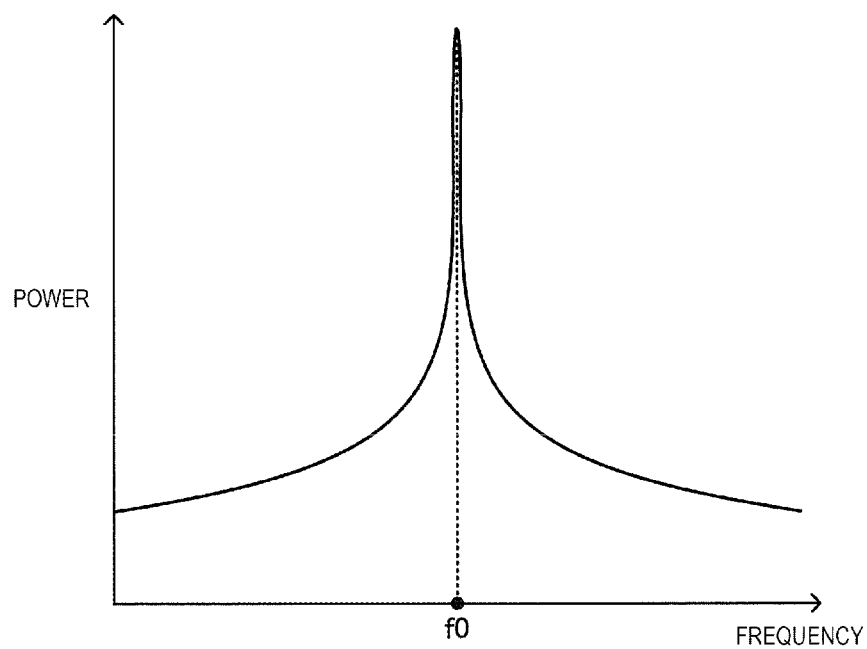
FIG. 4 is an explanatory diagram of spread spectrum.
Figure 5:
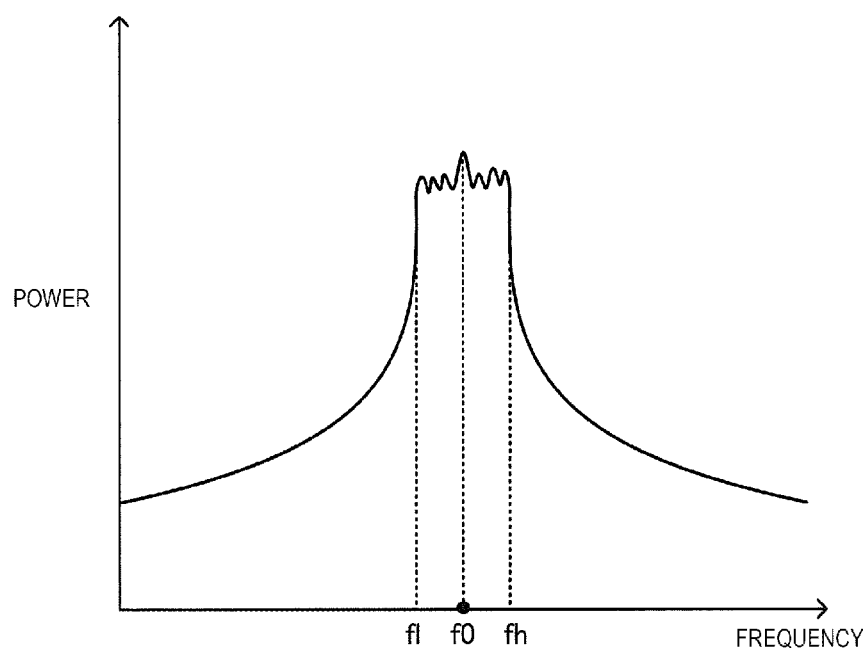
FIG. 5 is an explanatory diagram of spread spectrum.

FIG. 4 shows the frequency characteristics of the clock signal CKQ when the spread spectrum processing by the processing circuit 60 is turned off. The horizontal axis is frequency, and the vertical axis is power corresponding to electric power. When the spread spectrum is not performed, as shown in FIG. 4, a strong peak appears at the reference frequency f0, which is the nominal frequency of the clock signal CKQ, and an EMI problem occurs. On the other hand, FIG. 5 shows frequency characteristics of the clock signal CKQ when the spread spectrum processing by the processing circuit 60 is turned on. By performing the spread spectrum, the frequency of the clock signal CKQ periodically fluctuates in a range of f1 to fh with the reference frequency f0 as the center, thereby EMI can be suppressed.

Figure 6:
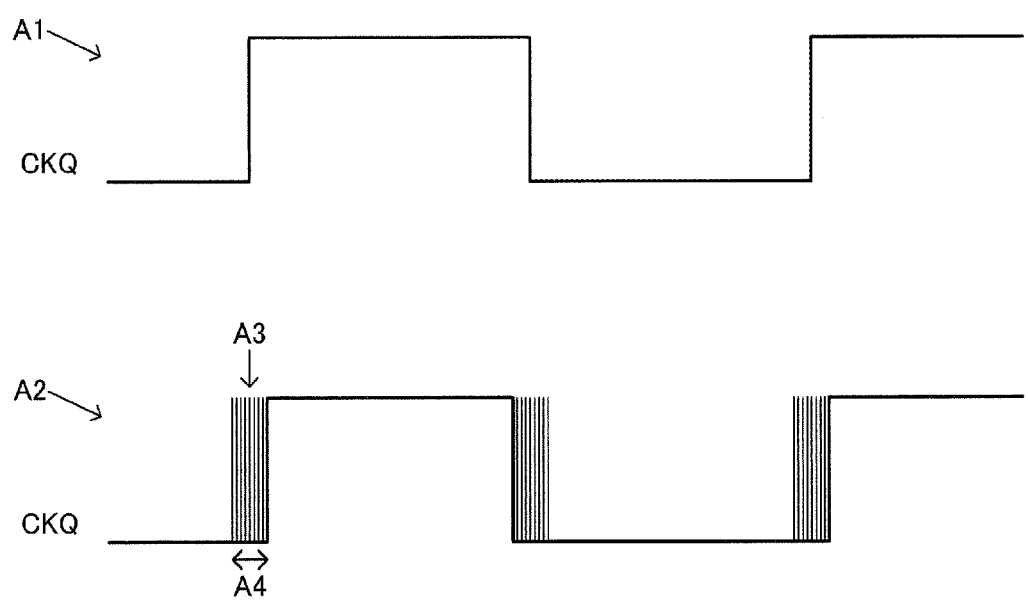
FIG. 6 is an explanatory diagram of spread spectrum.

A1 in FIG. 6 is a signal waveform of the clock signal CKQ when the spread spectrum is not performed, and A2 is a signal waveform of the clock signal CKQ when the spread spectrum is performed. By performing the spread spectrum, the edge of the clock signal CKQ periodically changes as indicated by A3 in FIG. 6. A4 in FIG. 6 corresponds to the spread width of the spread spectrum. In addition, as the amplitude of the waveform signal in FIG. 3 increases, the spread width increases, and as the amplitude of the waveform signal in FIG. 3 decreases, the spread width decreases. When the period TP of the waveform signal in FIG. 3 is shortened and the spread rate RA is increased, the fluctuating speed of the spread spectrum of A4 in FIG. 6 becomes fast. That is, the frequency fluctuates with a short period. On the other hand, when the period TP of the waveform signal is lengthened and the spread rate RA is lowered, the fluctuating speed of the spread spectrum of A4 in FIG. 6 becomes slow. That is, the frequency fluctuates with a long period.

Figure 7:
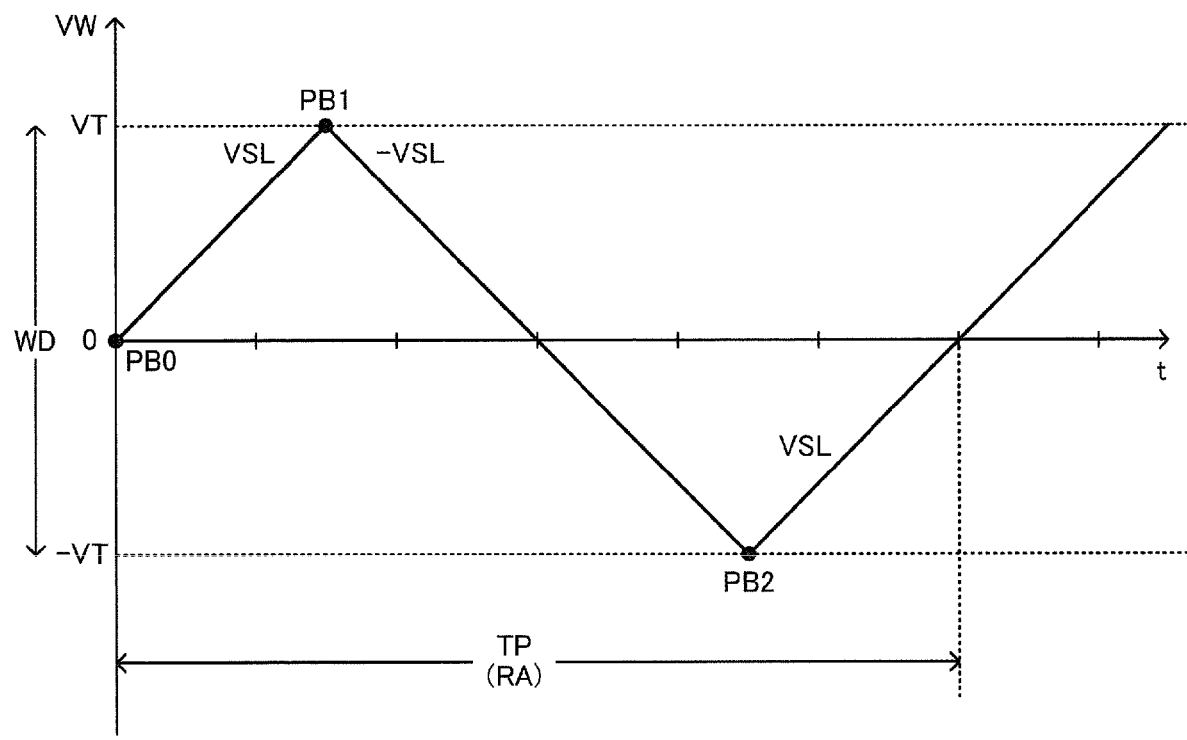
FIG. 7 is an explanatory diagram showing a problem of an example in the related art.
Figure 8:
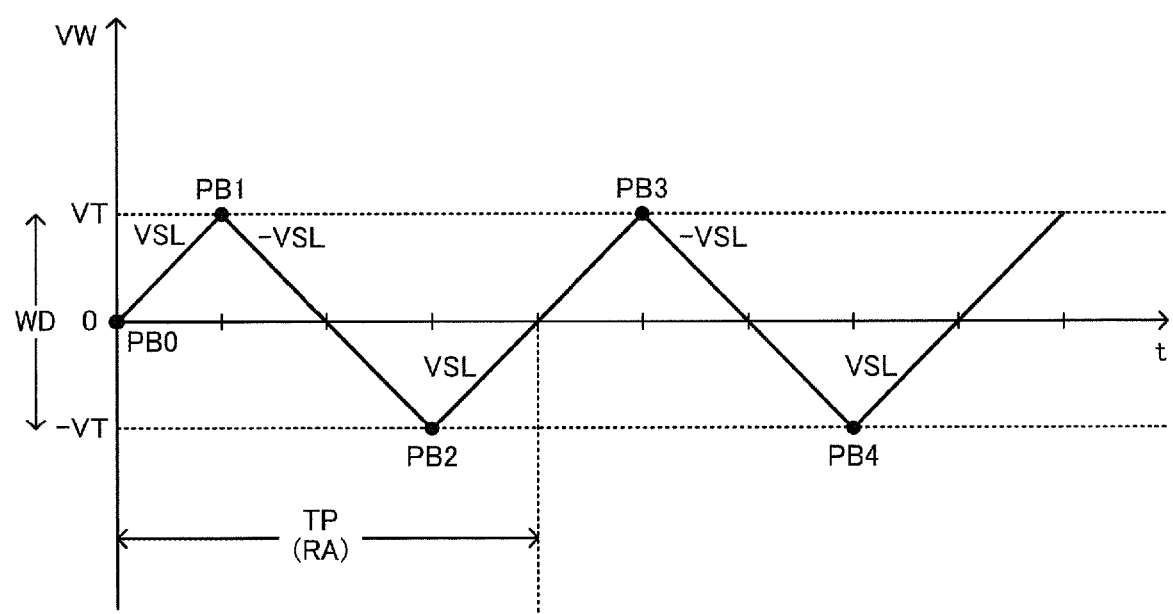
FIG. 8 is an explanatory diagram showing a problem of an example in the related art.

FIGS. 7 and 8 are explanatory diagrams of problems in the related art examples. In the related art example of JP-A-2016-40869 described above, the slope value of the waveform signal is fixed at +1 or −1, and the slope value cannot be changed variably. Therefore, when the amplitude of the waveform signal is changed to change the spread width WD of the spread spectrum, there arises a problem that the spread rate RA also changes accordingly.

For example, in FIG. 7, the spread width WD is made larger than the spread width WD in FIG. 3. When the spread width WD is increased, the frequency bandwidth of f1 to fh in FIG. 5 is widened, and the fluctuation width of A4 in FIG. 6 is increased. By doing so, the adverse effects of EMI can be further reduced. When the spread width WD is increased in this way, in the related art example, the slope value is a fixed value such as +1 or −1, so the period TP of the waveform signal becomes longer as shown in FIG. 7 and the spread rate RA becomes low.

On the other hand, in FIG. 8, the spread width WD is made smaller than the spread width WD in FIG. 3. When the spread width WD is reduced, the frequency bandwidth of f1 to fh in FIG. 5 is narrowed, and the fluctuation width of A4 in FIG. 6 is reduced. In this way, the effect of reducing the adverse effects of EMI is reduced compared to FIG. 7. When the spread width WD is reduced in this way, in the related art example, the slope value is a fixed value, so the period TP of the waveform signal becomes shorter as shown in FIG. 8 and the spread rate RA becomes high.

As described above, in the related art example, the slope value of the waveform signal is a fixed value such as +1 and −1, so when the spread width WD is increased, the spread rate RA is lowered, and when the spread width WD is reduced, the spread rate RA is increased. Therefore, there has been a problem that the spread rate RA cannot be made constant. For example, a user who incorporates the oscillator 4 into an electronic apparatus determines the spread width WD of the spread spectrum in consideration of the operating environment of the electronic apparatus and the radio wave environment. For example, when the fluctuation width of the clock signal CKQ indicated by A4 in FIG. 6 is increased by increasing the spread width WD, the data fetching operation using the clock signal CKQ is adversely affected. On the other hand, when the spread width WD is reduced, an EMI problem caused by the radiation of the electromagnetic wave of the clock signal CKQ occurs. For this reason, the user adjusts the spread width WD so as to be an optimum value in consideration of the operating environment and the radio wave environment of the electronic apparatus. When the spread width WD is changed by such adjustment, the situation where the spread rate RA is also changed in conjunction with the change in the spread width WD as shown in FIGS. 7 and 8 is undesirable for the user. In other words, the user desires to adjust the spread width WD while keeping the spread rate RA constant, but the method in the related art in which the slope value is fixed cannot meet such a user's request.

Figure 9:
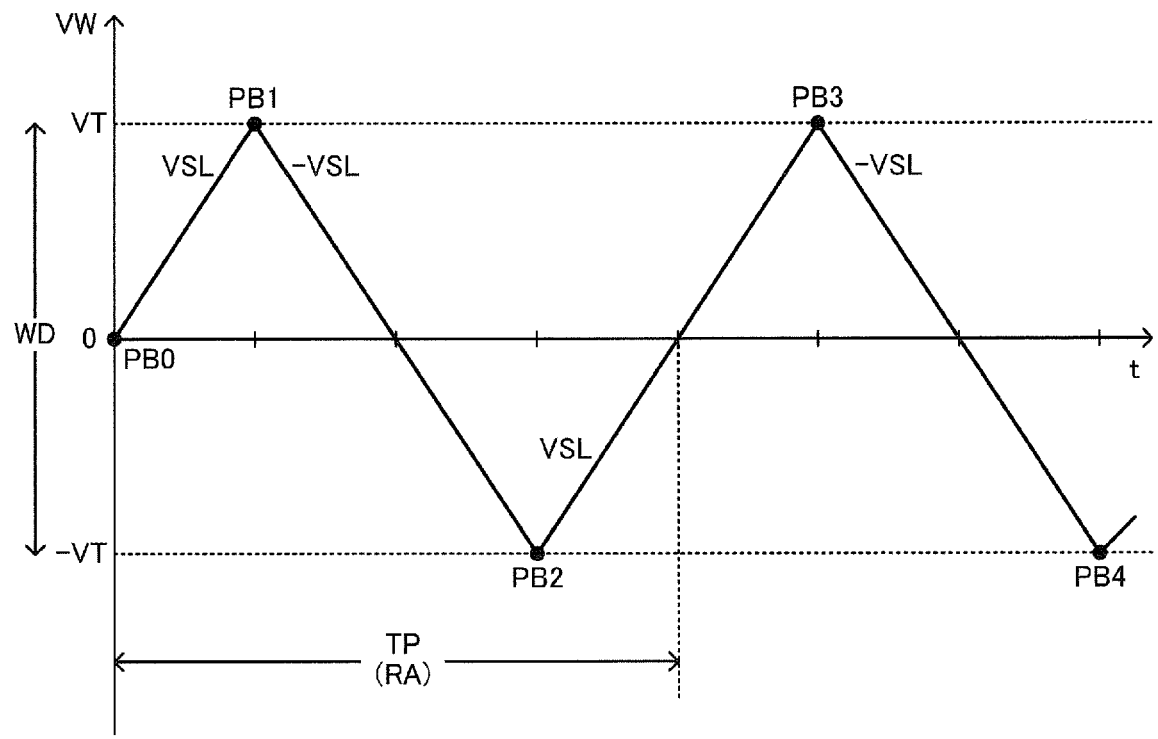
FIG. 9 is an explanatory diagram of a technique according to the present embodiment in which a spread rate and a spread width can be freely set.
Figure 10:
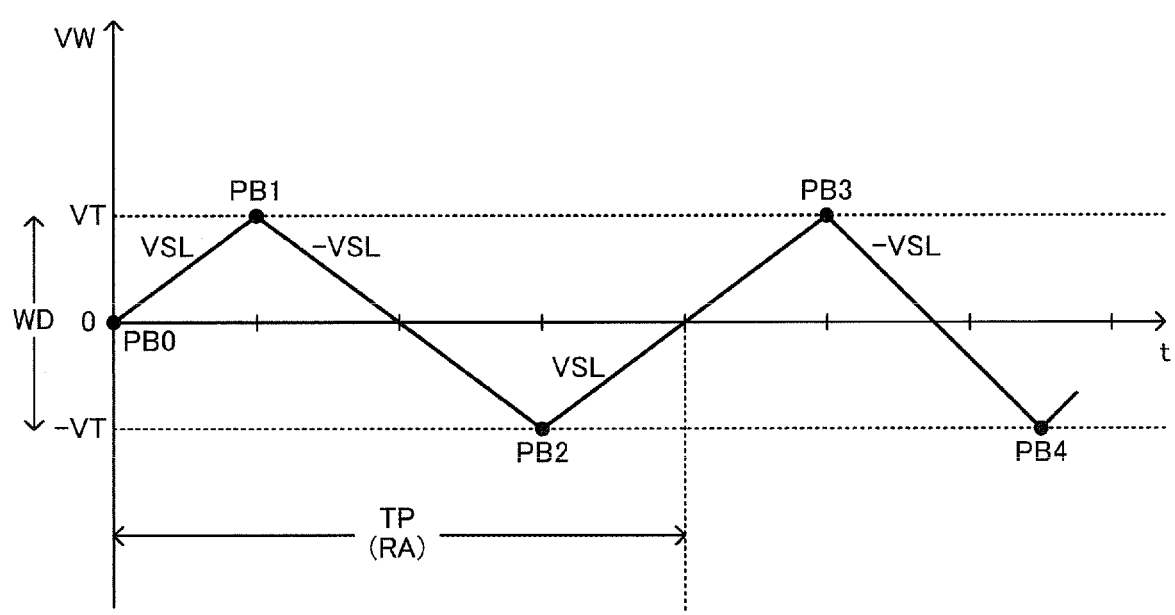
FIG. 10 is an explanatory diagram of a technique according to the present embodiment in which a spread rate and a spread width can be freely set.

In this regard, in the present embodiment, the slope information SL and the amplitude information AP can be set for the registers 80 and 82, and the waveform signal value VW is generated based on the slope information SL and the amplitude information AP, thereby, it becomes possible to freely adjust the spread rate RA and spread width WD of the spread spectrum. Accordingly, as shown in FIG. 9, when the spread width WD is increased, the spread rate RA does not change from FIG. 3 by increasing the slope value VSL. Further, as shown in FIG. 10, when the spread width WD is reduced, the spread rate RA does not change from FIG. 3 by decreasing the slope value VSL. That is, it is possible to adjust the spread width WD to be larger or smaller while keeping the spread rate RA constant. As a result, the spread width WD and spread rate RA of the spread spectrum can be adjusted to optimum values, and the user's convenience can be greatly improved.

3. Processing Circuit

Figure 11:
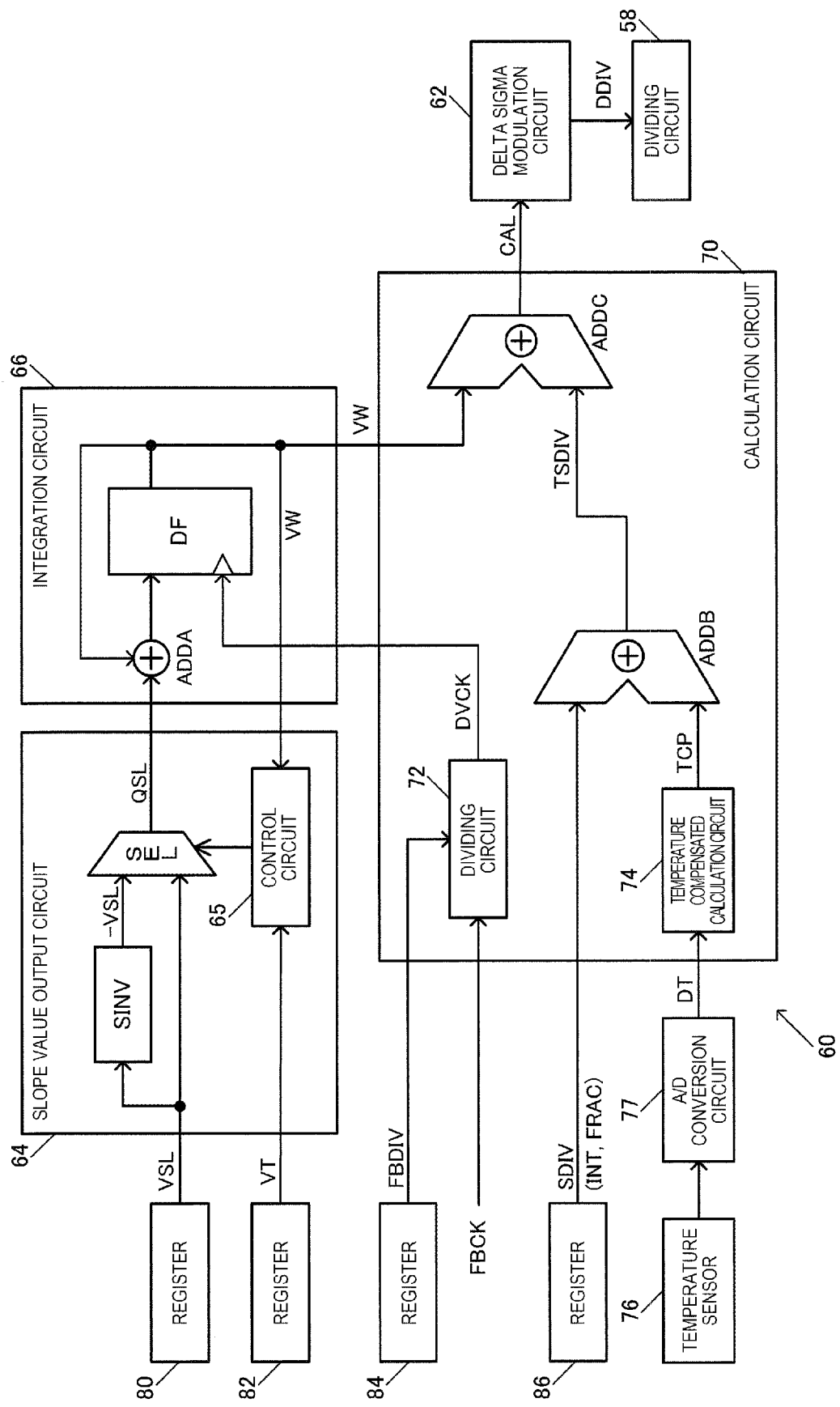
FIG. 11 shows a detailed configuration example of a processing circuit.

FIG. 11 shows a detailed configuration example of the processing circuit 60. As shown in FIG. 11, the processing circuit 60 includes the slope value output circuit 64, the integration circuit 66, the calculation circuit 70, and the delta sigma modulation circuit 62. The slope value output circuit 64 includes a sign inverter SINV, a selector SEL, and a control circuit 65. The integration circuit 66 includes an adder ADDA and a holding circuit DF. The calculation circuit 70 includes the dividing circuit 72, a temperature compensated calculation circuit 74, and adders ADDB and ADDC. The processing circuit 60 is not limited to the configuration shown in FIG. 11, and various modifications such as omitting some of these components or adding other components are possible.

In FIG. 11, the positive slope value VSL described in FIG. 3 is set in the register 80 as slope information SL. The sign inverter SINV inverts the sign of the positive slope value VSL and outputs a negative slope value −VSL. Specifically, the sign inverter SINV performs a sign inversion with a two's complement to the positive slope value VSL, and outputs a negative slope value −VSL.

The selector SEL receives a positive slope value VSL from the register 80 and a negative slope value −VSL from the sign inverter SINV. The selector SEL outputs either the positive slope value VSL or the negative slope value −VSL to the integration circuit 66 as an output slope value QSL under the control of the control circuit 65.

Specifically, the control circuit 65 receives the first threshold value VT set as the amplitude information AP for the register 82 and the waveform signal value VW from the integration circuit 66. As explained in FIG. 3, the control circuit 65 monitors the waveform signal value VW, and if the waveform signal value VW reaches the first threshold value VT when the positive slope value VSL is output as the output slope value QSL, the control circuit 65 controls the selector SEL so that the negative slope value −VSL is selected and output as the output slope value QSL. Thereby, switching of the output slope value QSL from VSL to −VSL at the point PB1 in FIG. 3 can be realized. Further, if the waveform signal value VW reaches the second threshold value −VT when the negative slope value −VSL is output as the output slope value QSL, the control circuit 65 controls the selector SEL so that the positive slope value VSL is selected and output as the output slope value QSL. Thereby, switching of the output slope value QSL from −VSL to VSL at the point PB2 in FIG. 3 can be realized.

As described above, the slope value output circuit 64 according to the present embodiment includes the sign inverter SINV that inverts the sign of the positive slope value VSL set as the slope information SL in the register 80 and outputs the negative slope value −VSL. The slope value output circuit 64 includes the selector SEL that selects either a positive slope value VSL from the register 80 or a negative slope value −VSL from the sign inverter SINV according to the amplitude information AP from the register 82 and the waveform signal value VW from the integration circuit 66.

According to such a configuration, when it is determined that the waveform signal value VW from the integration circuit 66 reaches the first threshold value VT set by the amplitude information AP, the selector SEL selects the negative slope value −VSL from the sign inverter SINV, and then the negative slope value −VSL is output as the output slope value QSL. Further, when it is determined that the waveform signal value VW from the integration circuit 66 reaches the second threshold value −VT set by the amplitude information AP, the selector SEL selects the positive slope value VSL from the register 80, and then the positive slope value VSL is output as the output slope value QSL. Accordingly, it is possible to realize the slope value output circuit 64 in which the spread width and spread rate of the spread spectrum can be variably set with a simple circuit configuration.

The adder ADDA of the integration circuit 66 performs adding processing of the output slope value QSL from the slope value output circuit 64 and the waveform signal value VW from the holding circuit DF. The holding circuit DF holds the addition result from the adder ADDA. Specifically, the holding circuit DF operates based on a divided clock signal DVCK from a dividing circuit 72 described later, and holds the addition result from the adder ADDA at the edge timing of the divided clock signal DVCK. By doing so, it is possible to realize integration processing for integrating the output slope value QSL from the slope value output circuit 64 for each clock cycle of the divided clock signal DVCK. As a result, as described with reference to FIG. 3, it is possible to realize a process in which the positive slope value VSL corresponding to the change value of the waveform signal value VW is integrated every clock cycle of the divided clock signal DVCK to increase the waveform signal value VW. It is also possible to realize a process in which the negative slope value −VSL corresponding to the change value of the waveform signal value VW is integrated every clock cycle of the divided clock signal DVCK to decrease the waveform signal value VW.

The temperature compensated calculation circuit 74 of the calculation circuit 70 performs calculation processing of the temperature compensation based on the temperature detection data DT to generate a temperature compensation value TCP. For example, the temperature compensation value TCP for compensating the temperature characteristics of the oscillation frequency of the vibrator 10 in FIGS. 1 and 2 is generated. For example, the temperature compensated calculation circuit 74 performs the calculation processing of the temperature compensation based on the temperature compensated coefficient data that is a coefficient of an approximate function, and generates a temperature compensation value TCP.

The register 86 stores a division ratio setting value SDIV. For example, the integer part INT and the fraction part FRAC of the division ratio setting value SDIV are stored. The adder ADDB performs adding processing of the division ratio setting value SDIV from the register 86 and the temperature compensation value TCP, and outputs the temperature compensated division ratio setting value TSDIV. The adder ADDC performs processing of adding the waveform signal value VW from the integration circuit 66 to the temperature compensated division ratio setting value TSDIV, and outputs a calculated value CAL. The delta sigma modulation circuit 62 performs a delta sigma modulation with respect to the calculated value CAL from the calculation circuit 70, and outputs the division ratio data DDIV to the dividing circuit 58.

With such a configuration, the temperature compensation value TCP is generated based on the temperature detection data DT based on the detection voltage of the temperature sensor 76, and the calculated value CAL can be obtained by performing the adding processing of the waveform signal value VW, the division ratio setting value SDIV, and the temperature compensation value TCP.

As shown in FIG. 11, the processing circuit 60 generates a waveform signal value VW based on the feedback clock signal FBCK. For example, the processing circuit 60 performs the integration processing on the slope information SL of the waveform signal based on the feedback clock signal FBCK to generate the waveform signal value VW. Specifically, the integration circuit 66 of the processing circuit 60 generates the waveform signal value VW by performing the integration processing of the output slope value QSL from the slope value output circuit 64.

For example, when generation processing of the waveform signal value VW for spread spectrum is performed based on a clock signal for spread spectrum that is asynchronous with the reference clock signal RFCK of the PLL circuit 40, a phase error occurs between the reference clock signal RFCK and the spread spectrum clock signal. Therefore, correction processing or the like of the waveform signal value VW for correcting the phase error is required.

In contrast, the processing circuit 60 in FIG. 11 generates a waveform signal value VW based on the feedback clock signal FBCK. The feedback clock signal FBCK is phase synchronized with the reference clock signal RFCK by the PLL circuit 40. In this way, in the present embodiment, the waveform signal value VW for spread spectrum is generated based on the feedback clock signal FBCK that is phase synchronized with the reference clock signal RFCK. Further, the waveform signal value VW is generated by the adding processing of the slope value. Therefore, it is possible in principle to eliminate the correction processing for correcting the phase synchronization as described above.

As shown in FIG. 11, the processing circuit 60 has the dividing circuit 72 that divides the feedback clock signal FBCK and outputs a divided clock signal DVCK, and generates the waveform signal value VW based on the divided clock signal DVCK. For example, the processing circuit 60 performs the integration processing on the slope information SL of the waveform signal based on the divided clock signal DVCK based on the feedback clock signal FBCK to generate the waveform signal value VW. Specifically, the integration circuit 66 of the processing circuit 60 generates the waveform signal value VW by performing the integration processing of the output slope value QSL for each clock cycle of the divided clock signal DVCK.

In this way, the frequency of the divided clock signal DVCK used for generating the waveform signal value VW can be variably changed by setting the division ratio FBDIV of the dividing circuit 72. As a result, it is possible to variably change the operation frequency of the integration processing of the output slope value QSL in the generation processing of the waveform signal value VW.

For example, the frequency of the triangular waveform signal can be made sufficiently smaller than the frequency of the clock signal CKQ. Therefore, the power consumption will be wasted when the waveform signal value VW is generated using a clock signal having an excessively high frequency. In this regard, in the present embodiment, the frequency of the divided clock signal DVCK used for generating the waveform signal value VW can be variably set by setting the division ratio FBDIV of the dividing circuit 72. Therefore, it is possible to prevent a situation where power consumption is wasted so that the waveform signal value VW can be generated based on the divided clock signal DVCK having a frequency suitable for generating the waveform signal value VW.

Further, the circuit device 20 according to the present embodiment includes the register 84 in which the division ratio FBDIV of the dividing circuit 72 is set, as shown in FIG. 11. The register 84 is a third register. When such a register 84 is provided, the frequency of the divided clock signal DVCK used for generating the waveform signal value VW can be variably set by changing the division ratio FBDIV set in the register 84. For example, as described in FIG. 2, when the external device accesses the register 84 via an interface circuit 92, the frequency of the divided clock signal DVCK used for generating the waveform signal value VW can be variably set by the external device. Note that a non-volatile memory may be provided in the circuit device 20, and the division ratio FBDIV stored in the non-volatile memory at the time of manufacturing the circuit device 20 may be loaded into the register 84 during the operation of the circuit device 20.

4. Oscillator

Figure 12:
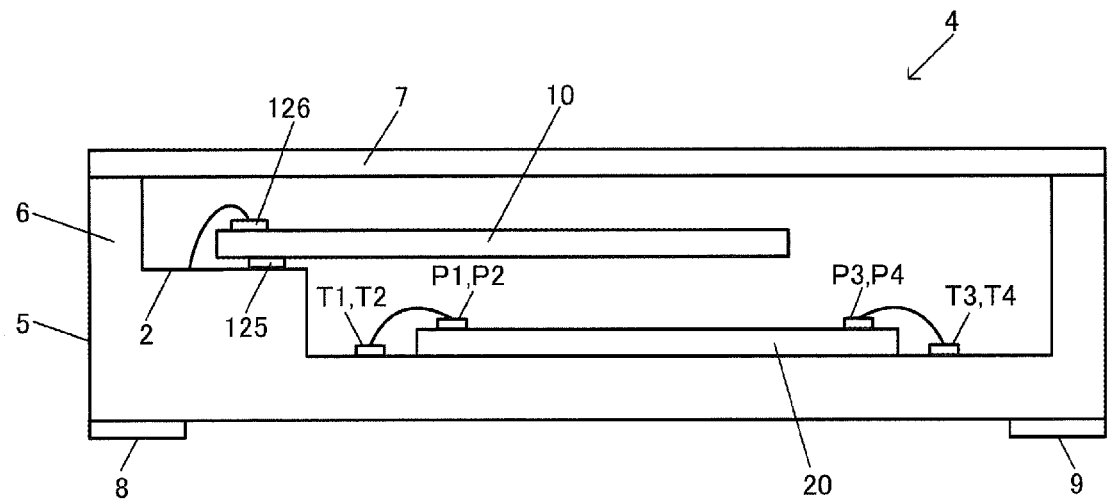
FIG. 12 shows a structural example of an oscillator.

Next, a structural example of the oscillator 4 of the present embodiment will be described. FIG. 12 is a cross-sectional diagram showing a structural example of the oscillator 4. The oscillator 4 includes a package 5 in which the vibrator 10 and the circuit device 20 are accommodated. The package 5 is made of, for example, ceramic, and has an accommodation space inside thereof, and the circuit device 20 and the vibrator 10 are accommodated in the accommodation space. The accommodation space is hermetically sealed and is preferably in a reduced pressure state that is close to a vacuum state. With the package 5, the vibrator 10 and the circuit device 20 can be suitably protected from impact, dust, heat, moisture, and the like. The package 5 has a base 6 and a lid 7. Specifically, the package 5 includes a base 6 that supports the vibrator 10 and the circuit device 20, and a lid 7 that is bonded to the upper surface of the base 6 so as to form an accommodation space with the base 6.

As shown in FIG. 12, the base 6 has a first recess portion opening on the upper surface and a second recess portion opening on the bottom surface of the first recess portion. A step portion 2 is provided on the bottom surface of the first recess portion, and the vibrator 10 is supported by the step portion 2. The terminal electrodes 125 and 126 of the vibrator 10 are electrically coupled to the internal terminals T1 and T2 of the oscillator 4 via the internal wiring or bonding wires of the package 5. The terminal electrodes 125 and 126 are also called pad electrodes. The internal terminals T1 and T2 are provided on the bottom surface of the second recess portion of the base 6. The internal terminals T1 and T2 are coupled to the vibrator couple terminals P1 and P2 of the circuit device 20 by, for example, the bonding wires. The terminals P1 and P2 are pads of the circuit device 20 that is a semiconductor chip. Thereby, the terminal electrodes 125 and 126 of the vibrator 10 and the terminals P1 and P2 of the circuit device 20 are electrically coupled each other. That is, the vibrator 10 and the oscillation circuit 30 are electrically coupled each other, and the oscillation operation of the vibrator 10 by the oscillation circuit 30 becomes possible.

The internal terminals T3 and T4 of the oscillator 4 are coupled to external coupling terminals P3 and P4 of the circuit device 20 by the bonding wires. The internal terminals T3 and T4 are provided on the bottom surface of the second recess portion of the base 6. The terminals P3 and P4 are pads of the circuit device 20. The internal terminals T3 and T4 of the oscillator 4 are electrically coupled to the external terminals 8 and 9 of the oscillator 4 via the internal wirings of the package 5. The external terminals 8 and 9 are formed on the outer bottom surface of the package 5. The external terminals 8 and 9 are coupled to an external device via the external wirings. The external wiring is, for example, wiring formed on a circuit substrate on which an external device is mounted. As a result, electrical coupling between the circuit device 20 and the external device becomes possible, and information can be exchanged between the circuit device 20 and the external device via, for example, the interface circuit 92 or the like in FIG. 2. Alternatively, power can be supplied to the circuit device 20. In FIG. 12, for convenience, it is explained that the number of terminals of the terminals P3 and P4 of the circuit device 20, the internal terminals T3 and T4 of the oscillator 4, and the external terminals 8 and 9 of the oscillator 4 are described as being two, but the number of terminals is actually three or more.

5. Electronic Apparatus and Moving Object

Figure 13:
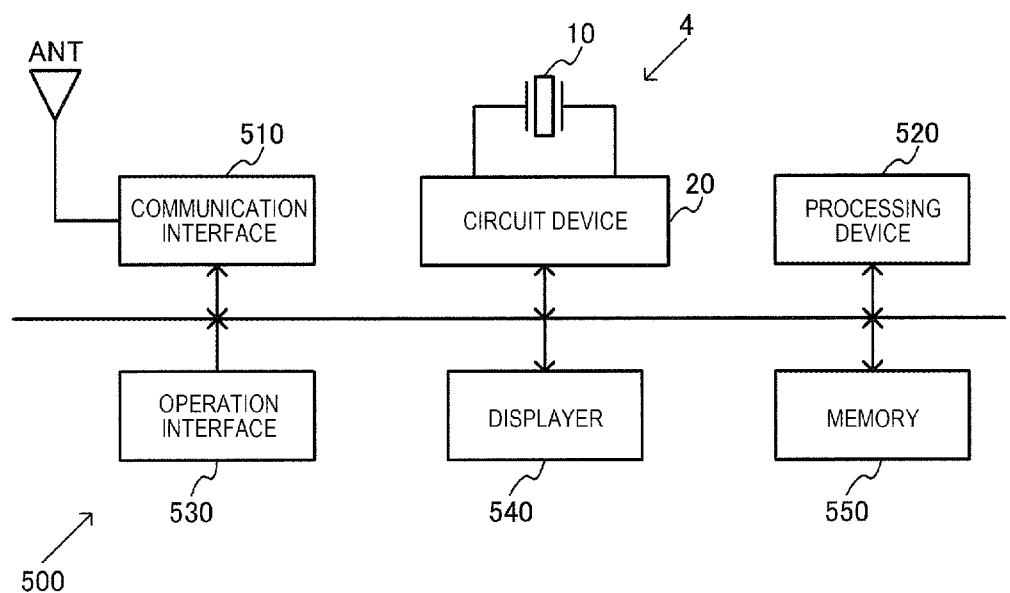
FIG. 13 shows a configuration example of an electronic apparatus.

FIG. 13 shows a configuration example of an electronic apparatus 500 including the circuit device 20 of the present embodiment. The electronic apparatus 500 includes the vibrator 10, the circuit device 20, and a processing device 520. The electronic apparatus 500 can include an antenna ANT, a communication interface 510, an operation interface 530, a displayer 540, and a memory 550. The oscillator 4 is configured with the vibrator 10 and the circuit device 20. The electronic apparatus 500 is not limited to the configuration shown in FIG. 13, and various modifications such as omitting some of these components or adding other components are possible.

The electronic apparatus 500 is, for example, a network-related apparatus such as a base station or a router, a high-precision measuring apparatus that measures physical quantities such as distance, time, flow velocity, or flow rate, a biological information measuring apparatus that measures biological information, or an in-vehicle apparatus. The biological information measuring apparatus is, for example, an ultrasonic measuring apparatus, a pulse wave meter, a blood pressure measuring apparatus, or the like. The in-vehicle apparatus is an apparatus for automatic driving or the like. The electronic apparatus 500 may be a wearable apparatus such as a head mounted type display device or a clock related apparatus, a mobile information terminal such as a robot, a printing device, a projection device, a smartphone, a content providing apparatus that delivers content, a video apparatus such as a digital camera or a video camera, or the like.

The communication interface 510 performs processing of receiving data from the outside via the antenna ANT and transmitting data to the outside. The processing device 520 that is a processor performs control processing of the electronic apparatus 500, various digital processing of data transmitted/received via the communication interface 510, or the like. The function of the processing device 520 can be realized, for example, by a processor such as a microcomputer. The operation interface 530 is for a user to perform an input operation, and can be realized by an operation button, a touch panel display, or the like. The displayer 540 displays various types of information and can be realized by a display such as a liquid crystal or an organic EL. The memory 550 stores data, and the function can be realized by a semiconductor memory such as a RAM or a ROM.

Figure 14:
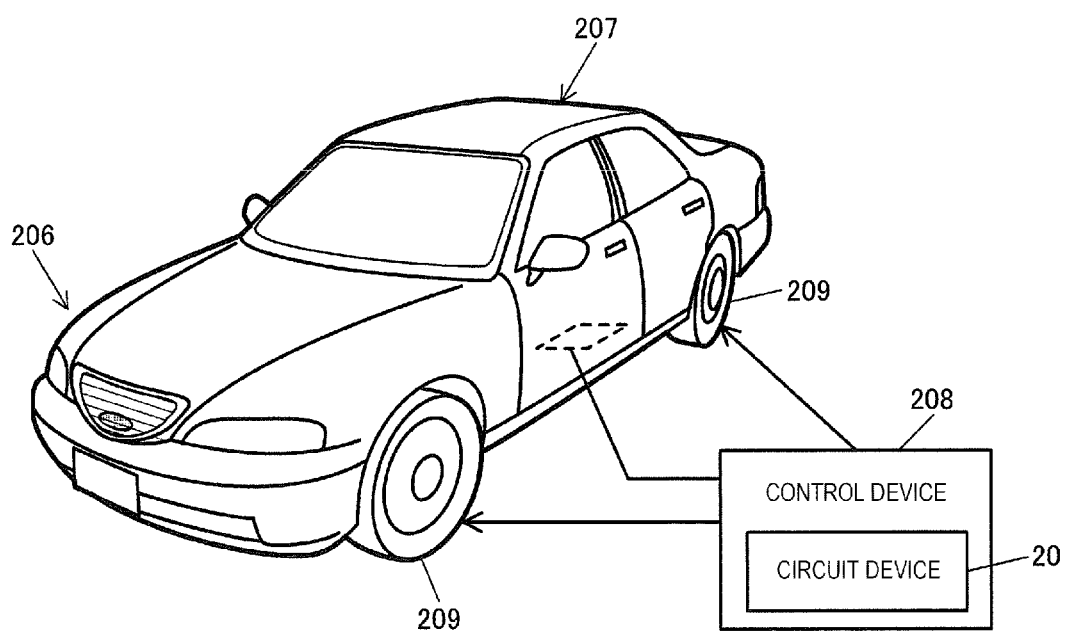
FIG. 14 shows a configuration example of a moving object.

FIG. 14 shows an example of a moving object including the circuit device 20 of the present embodiment. The circuit device 20 of the present embodiment can be incorporated into various moving objects such as vehicles, airplanes, motorcycles, bicycles, or ships. The moving object is an apparatus/device that moves on the ground, in the sky, or on the sea, and includes a driving mechanism such as an engine or a motor, a steering mechanism such as a steering wheel or a rudder, and various electronic apparatuses. FIG. 14 schematically shows an automobile 206 as a specific example of the moving object. The automobile 206 incorporates an oscillator (not shown) having the circuit device 20 of the present embodiment. A control device 208 operates with a clock signal generated by the oscillator. The control device 208, for example, controls the hardness of the suspension according to the posture of a vehicle body 207, and controls brakes of the individual wheels 209. For example, automatic driving of the automobile 206 may be realized by the control device 208. The apparatus in which the circuit device 20 of the present embodiment is incorporated is not limited to such a control device 208, and can be incorporated in various in-vehicle apparatuses such as a meter panel apparatus and a navigation apparatus provided in a moving object such as the automobile 206.

As described above, the circuit device of the present embodiment includes the phase comparison circuit for performing phase comparison between the reference clock signal and the feedback clock signal, the control voltage generation circuit for generating a control voltage based on the result of the phase comparison, the voltage controlled oscillation circuit for generating a clock signal having a frequency corresponding to the control voltage, the dividing circuit for dividing the clock signal and outputting a feedback clock signal, and the processing circuit for setting a division ratio of the dividing circuit. The circuit device also includes the first register in which the slope information of the waveform signal for spreading the frequency of the clock signal is set, and the second register in which the amplitude information of the waveform signal is set. The processing circuit generates a waveform signal value of the waveform signal based on the slope information set in the first register and the amplitude information set in the second register, and outputs division ratio data based on the waveform signal value and the division ratio setting value to the dividing circuit.

According to the present embodiment, the waveform signal value of the waveform signal is generated based on the slope information and amplitude information of the waveform signal for spreading the frequency of the clock signal, and the division ratio data based on the waveform signal value and the division ratio setting value is output to the dividing circuit. After that, the phase comparison between the feedback clock signal from the dividing circuit and the reference clock signal is performed to generate a control voltage, and a clock signal having a frequency corresponding to the control voltage is generated. In this way, a waveform signal for frequency spreading of the clock signal is generated using not only the amplitude information but also the slope information, and frequency spreading is performed on the clock signal. Since it becomes possible to set the spread rate of the frequency spread of the clock signal by using the slope information while setting the spread width of the frequency spread of the clock signal by using the amplitude information, it is possible to provide a circuit device or the like that can freely set the spread rate and spread width of the frequency spread of the clock signal.

In the present embodiment, the processing circuit may perform a delta sigma modulation with respect to a calculated value based on the waveform signal value and the division ratio setting value, and output the division ratio data to the dividing circuit.

In this way, the fractional N type PLL circuit can be realized by delta sigma modulation, and the division ratio of the dividing circuit changes with time so that the frequency of the clock signal periodically changes in a frequency bandwidth centered on the reference frequency, thereby, the frequency spread of the clock signal can be also realized.

In the present embodiment, the processing circuit may generate a temperature compensation value of the temperature characteristics of the reference clock signal based on the temperature detection data based on the detection voltage of the temperature sensor, and perform the adding processing of the waveform signal value, the division ratio setting value, and the temperature compensation value to obtain a calculated value.

In this way, it is possible to realize a fractional N type PLL circuit and suppression of the adverse effects of EMI, and it is also possible to realize temperature compensated processing in which fluctuations in the frequency of the clock signal due to temperature changes can be suppressed.

In the present embodiment, the processing circuit integrates the slope value output circuit that outputs either the positive slope value or the negative slope value as the output slope value based on the slope information, and the output slope value. In addition, the processing circuit includes the integration circuit that outputs an integrated value obtained by integration as a waveform signal value. When outputting the positive slope value as an output slope value, the slope value output circuit outputs the negative slope value as an output slope value when the waveform signal value reaches a first threshold value set by the amplitude information. If the waveform signal value reaches the second threshold value set by the amplitude information when outputting the negative slope value as an output slope value, a positive slope value may be output as the output slope value.

In this way, the frequency spread processing of the clock signal in which the spread rate and the spread width can be set variably can be realized with a simple circuit configuration using the slope value output circuit and the integration circuit.

Further, in the present embodiment, the slope value output circuit may include the sign inverter that inverts a positive slope value set as slope information in the first register and outputs a negative slope value, and the selector that selects either the positive slope value from the first register or the negative slope value from the sign inverter according to the amplitude information from the second register and the waveform signal value from the integration circuit.

In this way, when the waveform signal value reaches the first threshold value, the selector selects a negative slope value from the sign inverter so that a negative slope value is output as the output slope value, and when the waveform signal value reaches the second threshold value, the selector selects a positive slope value so that a negative slope value is output as the output slope value.

In the present embodiment, the processing circuit may generate the waveform signal value based on the feedback clock signal.

In this way, the waveform signal value for frequency spreading of the clock signal can be generated based on the feedback clock signal that is phase synchronized with the reference clock signal.

In the present embodiment, the processing circuit may have a second dividing circuit that divides the feedback clock signal and outputs a divided clock signal, and generate a waveform signal value based on the divided clock signal.

In this way, the frequency of the divided clock signal used for generating the waveform signal value can be variably changed by setting the division ratio of the second dividing circuit, and also, the operating frequency of the output slope value integration processing can be variably changed in the generation processing of the waveform signal value.

In the present embodiment, a third register in which the division ratio of the second dividing circuit is set may be included.

In this way, the frequency of the divided clock signal used for generating the waveform signal can be variably set by changing the division ratio set in the third register.

The present embodiment also relates to an oscillator including the vibrator and the circuit device described above, the circuit device including the oscillation circuit that oscillates the vibrator.

The present embodiment relates to an electronic apparatus including the circuit device described above.

Further, the present embodiment relates to a moving object including the circuit device described above.

Although the present embodiment has been described in detail as described above, it will be easily understood by those skilled in the art that many modifications can be made without departing from the novel matters and effects of the present disclosure. Accordingly, all such modifications are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. In addition, the configurations/operations of the circuit device, the processing circuit, the oscillator, the electronic apparatus, and the moving object are not limited to those described in this embodiment, and various modifications can be made.

What is claimed is:

1. A circuit device comprising:
    a phase comparison circuit configured to perform a phase comparison between a reference clock signal and a feedback clock signal;
    a control voltage generation circuit configured to generate a control voltage based on a result of the phase comparison;
    a voltage controlled oscillation circuit configured to generate a clock signal having a frequency corresponding to the control voltage;
    a dividing circuit that divides the clock signal and outputs the feedback clock signal;
    a processing circuit configured to set a division ratio of the dividing circuit;

a first register in which slope information of a waveform signal for spreading the frequency of the clock signal is set; and a second register in which amplitude information of the waveform signal is set, wherein the processing circuit generates a waveform signal value of the waveform signal based on the slope information set in the first register and the amplitude information set in the second register, outputs division ratio data based on the waveform signal value and a division ratio setting value to the dividing circuit; and generates the waveform signal value based on the feedback clock signal.

2. A circuit device comprising:

a phase comparison circuit configured to perform a phase comparison between a reference clock signal and a feedback clock signal;

a control voltage generation circuit configured to generate a control voltage based on a result of the phase comparison;

a voltage controlled oscillation circuit configured to generate a clock signal having a frequency corresponding to the control voltage;

a dividing circuit that divides the clock signal and outputs the feedback clock signal;

a processing circuit configured to set a division ratio of the dividing circuit;

a first register in which slope information of a waveform signal for spreading the frequency of the clock signal is set; and a second register in which amplitude information of the waveform signal is set, wherein the processing circuit:

generates a waveform signal value of the waveform signal based on the slope information set in the first register and the amplitude information set in the second register, and outputs division ratio data based on the waveform signal value and a division ratio setting value to the dividing circuit by performing a delta sigma modulation on a calculated value based on the waveform signal value and the division ratio setting value, and outputs the division ratio data to the dividing circuit.

3. The circuit device according to claim 2, wherein the processing circuit generates a temperature compensation value of temperature characteristics of the reference clock signal based on temperature detection data based on a detection voltage of a temperature sensor, and obtains the calculated value by performing adding processing on the waveform signal value, the division ratio setting value, and the temperature compensation value.

4. A circuit device comprising:

a phase comparison circuit configured to perform a phase comparison between a reference clock signal and a feedback clock signal;

a control voltage generation circuit configured to generate a control voltage based on a result of the phase comparison;

a voltage controlled oscillation circuit configured to generate a clock signal having a frequency corresponding to the control voltage;

a dividing circuit that divides the clock signal and outputs the feedback clock signal;

a processing circuit configured to set a division ratio of the dividing circuit;

a first register in which slope information of a waveform signal for spreading the frequency of the clock signal is set; and a second register in which amplitude information of the waveform signal is set, wherein the processing circuit:

generates a waveform signal value of the waveform signal based on the slope information set in the first register and the amplitude information set in the second register, and outputs division ratio data based on the waveform signal value and a division ratio setting value to the dividing circuit;

wherein the processing circuit comprises:

a slope value output circuit that outputs either a positive slope value or a negative slope value as an output slope value based on the slope information; and an integration circuit that integrates the output slope value and outputs an integrated value obtained by the integration as the waveform signal value; and wherein the slope value output circuit:

outputs the negative slope value as the output slope value when the positive slope value is output as the output slope value and the waveform signal value reaches a first threshold value set by the amplitude information; and outputs the positive slope value as the output slope value when the negative slope value is output as the output slope value and the waveform signal value reaches a second threshold value set by the amplitude information.

5. The circuit device according to claim 4, wherein the slope value output circuit includes a sign inverter that inverts a sign of the positive slope value set as the slope information in the first register and outputs the negative slope value, and a selector that selects either the positive slope value from the first register or the negative slope value from the sign inverter according to the amplitude information from the second register and the waveform signal value from the integration circuit.

6. The circuit device according to claim 1, wherein the processing circuit has a second dividing circuit that divides the feedback clock signal and outputs a divided clock signal, and generates the waveform signal value based on the divided clock signal.

7. The circuit device according to claim 6, further comprising:

a third register in which a division ratio of the second dividing circuit is set.

8. An oscillator comprising:

a vibrator; and the circuit device according to claim 1 including an oscillation circuit that oscillates the vibrator.

9. An electronic apparatus comprising the circuit device according to claim 1.

10. A moving object comprising the circuit device according to claim 1.

* * * * *